United States Patent [19]
DiDio et al.

[11] Patent Number: 5,180,434
[45] Date of Patent: Jan. 19, 1993

[54] INTERFACIAL PLASMA BARS FOR PHOTOVOLTAIC DEPOSITION APPARATUS

[75] Inventors: Gary M. DiDio, Highland; Kermit Jones, Rochester; Kevin Hoffman, Sterling Heights; Timothy Laarman, Almont; Jon Call, Royal Oak; Prem Nath, Rochester Hills, all of Mich.

[73] Assignee: United Solar Systems Corporation, Troy, Mich.

[21] Appl. No.: 667,262

[22] Filed: Mar. 11, 1991

[51] Int. Cl.$^5$ ............... C23C 16/50; C23C 16/54
[52] U.S. Cl. .................. 118/718; 118/719; 118/723; 118/724; 427/570
[58] Field of Search ............ 118/718, 719, 723

[56] References Cited
U.S. PATENT DOCUMENTS
4,479,455 10/1984 Doehler et al. ............... 118/718

Primary Examiner—Brian E. Hearn
Assistant Examiner—Jonathan D. Baskill
Attorney, Agent, or Firm—Krass & Young

[57] ABSTRACT

In continuous apparatus for the glow discharge deposition of amorphous silicon alloy solar cells of p-i-n-type configuration in a plurality of interconnected, dedicated deposition chambers, a plasma bar operatively disposed between at least the plasma regions in which the layer pairs of amorphous silicon alloy material defining the major semiconductor junction of the solar cell are deposited. The plasma bar is adapted to initiate a plasma so as to prevent chemically adsorbed contaminants from deleteriously affecting the surface of the first deposited of the layer pair, thereby improving the open circuit voltage of the solar cell. In a similar manner, the plasma bar may also be provided between the layer pairs of amorphous silicon alloy material which combine to define the minor semiconductor junction of the solar cell. Finally, a plasma bar may be disposed between the oxide-based layer of a back reflector for reducing oxygen contamination of the silicon alloy material deposited thereupon.

14 Claims, 2 Drawing Sheets

INTERFACIAL PLASMA BARS FOR PHOTOVOLTAIC DEPOSITION APPARATUS

FIELD OF THE INVENTION

This invention relates generally to thin film amorphous silicon alloy devices and more particularly to improved apparatus for the continuous deposition of tandem photovoltaic cells from successively deposited layers of amorphous silicon alloy material, the interfacial surfaces of which have been cleansed by a plasma process so as to improve photoconversion efficiency and shorten the length of the deposition apparatus.

BACKGROUND OF THE INVENTION

Owing to the increasing scarcity of non-renewable energy reserves such as coal, petroleum and uranium, increased use is being made of alternative nondepletable energy sources, such as photovoltaic energy. Single crystal photovoltaic devices, especially crystalline silicon photovoltaic devices, have been utilized for some time as sources of electrical power because they are inherently non-polluting, silent and consume no expendable natural resources in their operation. However, the utility of such devices has been limited by problems associated with the manufacture thereof. More particularly, single crystal materials are difficult to produce in sizes larger than several inches in diameter, are thicker and heavier than their thin film counterparts, and are expensive and time consuming to fabricate.

Considerable efforts have recently been expended to develop systems and processes for preparing thin film amorphous semiconductor materials which encompass relatively large areas and which can be deposited so as to form p-type and n-type semiconductor layers for the production therefrom of thin film n-i-p type photovoltaic cells which are substantially operatively equivalent or superior to their crystalline counterparts. It should be noted at this point that the term "amorphous", as used herein, is defined to include alloys or materials exhibiting long range disorder, although said alloys or materials may exhibit short or intermediate range order or even contain crystalline inclusions.

Amorphous thin film semiconductor alloys have gained acceptance for the fabrication of electronic devices such as photovoltaic cells, photoresponsive devices, photoconductive devices, transistors, diodes, integrated circuits, memory arrays and the like. This is because the amorphous thin film materials (1) can now be manufactured by relatively low cost continuous processes, (2) possess a wide range of controllable electrical, optical and structural properties, and (3) can be deposited to cover relatively large areas. Among the amorphous semiconductor materials exhibiting the greatest present commercial significance are amorphous silicon and amorphous silicon-germanium alloys.

The assignee of the instant invention has previously developed a process and apparatus for the continuous glow discharge deposition of successive layers of doped and intrinsic amorphous silicon alloy material onto a web of substrate material, such as stainless steel, so as to fabricate, in an inexpensive process specifically adapted for mass production, a photovoltaic cell. In said process, isolated chambers are dedicated for the successive deposition of each discrete layer of amorphous silicon alloy material. Such continuous processing apparatus is disclosed in the following U.S. patents, the disclosures of which are incorporated herein by reference: U.S. Pat. No. 4,400,409, for "A Method of Making P-Doped Silicon Films and Devices Made Therefrom"; U.S. Pat. No. 4,410,598, for "Continuous Amorphous Silicon Solar Cell Production System"; and U.S. Pat. No. 4,438,723 for "Multiple Chamber Deposition and Isolation System and Method."

In machines previously built by the assignee of the instant invention, the photovoltaic cells included six discrete layers, i.e., a first n-type layer, a first intrinsic layer, a first p-type layer, a second n-type layer, a second intrinsic layer and a second p-type layer. In this manner, a "tandem" photovoltaic cell was fabricated comprising two distinct solar cells optically and electrically connected together in series. By varying the optical band gap of each of the layers of intrinsic silicon alloy material, different wavelengths of light present in the incident solar spectrum was absorbed in each of those intrinsic layers. And due to the fact that multiple intrinsic layers are available for the absorption of photons of incident radiation, each intrinsic layer was relatively thin so that the internal electrical field generated by the doped layers acting on the charge carriers photogenerated in the intrinsic layers was maximized and operated to efficiently separate and collect those charge carriers before recombination occurred.

In the glow discharge deposition of amorphous silicon alloy material, specific precursor gas mixtures are fed into each of the discrete deposition chambers. The r.f. electrical field established interiorly of the deposition chamber decomposes said gas mixture and causes the disassociated gas fragments to be deposited onto the surface of a grounded substrate. For instance, a mixture of silane, hydrogen, argon and silicon tetrafluoride is fed into the intrinsic deposition chamber and a mixture of silane, hydrogen and boron tetrafluoride is fed into the p-type deposition chamber operatively disposed adjacent thereto and in operative communication therewith. Since the process is a continuous one in which deposition occurs in discrete chambers, an opening between those adjacent deposition chambers must constantly be maintained. However, the boron from the p-type deposition chamber represents an impurity if introduced into the intrinsic deposition chamber and accordingly cannot be permitted to enter said intrinsic chamber through said opening without deleteriously affecting the overall performance of the photovoltaic cell.

In order to prevent the diffusion of boron into the intrinsic deposition chamber, the assignee of the instant invention has also previously developed "gas gates" which are adapted to be operatively positioned between said adjacent chambers. These gas gates operate by establishing a flow of an inert gas (or a gas which is common to the layers of amorphous silicon alloy material deposited in both of the contiguous, operatively interconnected chambers) in a direction opposite to the direction of flow of the "contaminant" gas. By designing the length and height of the gas gate to be sufficient, molecules of the diffusing contaminant gas will encounter and collide with molecules of the inert gas, thereby ensuring that the unused contaminant gas will be removed through the exhaust conduit in the deposition chamber in which it is introduced rather than diffusing into the adjacent deposition chamber and being deposited as part of the precursor deposition gas mixture introduced into said adjacent chamber. It is critical to note at this juncture that these gas gates could only prevent contamination of one deposition chamber from free-flowing gaseous species present in the adjacent chamber. These gas gates offered no protection from contaminants chemically absorbed on the surface of the substrate passing between the adjacent chambers. It is one of the objects of the instant invention to prevent contamination due to chemically absorbed species.

Those of ordinary skill in the art of solar cell fabrication, reading the instant specification, will readily appreciate that the lengths of each of the deposition chambers are proportional to the thickness of the discrete layers of amorphous silicon alloy material deposited therewithin. For instance, the doped layers of amorphous silicon alloy material are each about 100 angstroms thick, whereas the thickness of each of the intrinsic layers of amorphous silicon alloy material, in a two cell tandem configuration, will be about 1000 to 4500 angstroms thick. Correspondingly, the length of the doped deposition chambers will be about three feet in length. It should also be appreciated that the gas gates will also vary in length from about eight inches for the gas gates separating and isolating the gaseous contents of the doped and intrinsic deposition chambers; and sixteen inches in length for the gas gate separating the contiguous doped deposition chambers in which the top layer of the first stacked cell and the bottom layer of the second stacked cell are deposited.

In addition to the chambers already described hereinabove, the deposition apparatus also requires a payout chamber from which the web of the substrate material is dispensed and a take-up chamber in which the web of substrate material with the layers of amorphous silicon alloy material deposited thereupon is wound for downstream processing into completed photovoltaic modules.

Finally, it is also important to mention that an additional plasma process occurs to help improve the performance of the photovoltaic cells. Again, note that each stacked cell is of a p-i-n-type configuration. In such a configuration, the interface which exists between the p doped layer of amorphous silicon alloy material and the intrinsic layer of amorphous silicon alloy material forms the "major semiconductor junction" of the photovoltaic cell. In order to affect the best possible semiconductor junction condition, the assignee of the instant invention routinely subjects said intrinsic layer to a plasma treatment prior to the deposition upon that surface of the p-doped layer. This plasma treatment passivates dangling, missing, or broken bonds or otherwise decreases the density of defect states present in the host matrix of the amorphous silicon alloy material. In order to effectuate that plasma, the deposition apparatus has heretofore incorporated an additional elongated chamber operatively disposed between the p-doped chamber and the intrinsic chamber. Of course, such a plasma chamber serves to add yet further length to the deposition apparatus, especially considering the fact that it is preferred to passivate the deposition surface existing between each of the interfacial layers of the tandem photovoltaic device.

As mentioned hereinabove, stacked, large area photovoltaic devices are currently being manufactured by the assignee of the instant invention on a commercial basis by utilizing the previously referenced, continuous deposition, roll-to-roll processor. That processor is characterized as having a 1.5 megawatt capacity in its annual output of photovoltaic power. Said 1.5 megawatt processor is adapted to produce tandem photovoltaic cells which comprise two stacked n-i-p type photovoltaic devices disposed optically and electrically in series upon a stainless steel substrate. The processor currently includes six operatively interconnected deposition chambers, each deposition chamber adapted to sequentially deposit one of the layers of silicon alloy material from which the tandem device is fabricated. With the addition of all of the aforementioned chambers, the 1.5 megawatt processor has a total length of approximately 40 feet. The assignee of the instant invention is currently designing a 10 megawatt machine for the continuous fabrication of significantly higher outputs of photovoltaic power. In order to produce an annual output of 10 megawatts of electrical power, the length of the machine will be increased significantly.

A first reason for the increased length of the processor is that it will be specially configured to fabricate three stacked photovoltaic cells; therefore, the processor will require 9 dedicated deposition chambers instead of the six dedicated chambers required by the 1.5 megawatt processor. A second major factor in determining the length of the processor is the aforementioned fact that the length of each chamber is dependent on the thickness of the layer being deposited therein. The thickness of the material is dependent upon the rate of deposition of the particular gas mixtures and the speed of the web of substrate material passing through that chamber of the processor. Assuming that the rate of deposition remains substantially constant, the web speed will have to be kept constant and the 10 megawatt processor will be about seven times longer than the 1.5 megawatt processor. Even assuming that the presently employed one foot wide web of substrate material were increased in width to two feet, a scaled-up version of the processor would be over 100 feet in length.

It should therefore be abundantly clear to the reader that, as the 1.5 megawatt processor is scaled up to higher throughput capacities, it becomes an economic necessity to substantially reduce the overall length thereof. It is to the end of decreasing the overall length of the roll-to-roll deposition apparatus that the second major advantage of the instant invention is directed.

The third and final major advantage of the instant invention resides in the plasma cleansing and/or passivation of at least the major junction interface formed between two of the successively deposited layers of amorphous silicon alloy material of each of the stacked cells of a photovoltaic device.

BRIEF SUMMARY OF THE INVENTION

There is disclosed in the instant patent application apparatus adapted to successively glow discharge deposit at least one triad of layers of p-i-n-type amorphous silicon alloy material atop a substrate passing through discrete p-i-n deposition regions. Each of the triad of p-i-n-type layers forms a solar cell. Each of these discrete solar cells includes a p-i semiconductor junction and an i-n semiconductor junction. One of the p-i or the i-n junctions defines the major semiconductor junction of said solar cells. The apparatus includes electrically conductive bar means and current generation means for initiating a glow discharge plasma between at least the region in which the layers of amorphous silicon alloy material that define the major junction of the p-i-n-type solar cell are deposited. The glow discharge so generated is adapted to clean as well as passivate the exposed surface of the first deposited layer of the layer pair, before the second layer of the layer pair is deposited thereupon. As used herein, the term "clean" shall refer to the removal of chemically adsorbed contaminant atoms from the exposed substrate surfaces.

The apparatus further includes a plurality of discrete deposition chambers. The number of the discrete chambers is equal to the number of layers of silicon alloy material to be deposited atop the substrate. It is preferred that the apparatus will also include means for depositing at least two triads of layers of silicon alloy material in discrete, dedicated deposition chambers as well as bar means for initiating a glow discharge deposition plasma between at least those adjacent layers of silicon alloy material which define the major junction of each of said at least two triads. The substrate is preferably an elongated web adapted to continuously pass through each of the discrete deposition chambers, the web preferably formed of an electrically conductive material.

Since the p-i interface is the major semiconductor junction, the intrinsic layer of amorphous silicon alloy material is subjected to a plasma treatment for cleaning the exposed surface thereof and for the passivation of that surface prior to the deposition thereupon of the p-layer of amorphous silicon alloy material. Preferably, a source of hydrogen gas is provided for subjecting the intrinsic layer silicon alloy material to a hydrogen plasma to effect said plasma treatment. There is further provided means for initiating a glow discharge plasma between the minor i-n semiconductor junction so as to clean and/or passivate the exposed surface of the n-layer of silicon alloy material prior to the deposition thereupon of the intrinsic layer of silicon alloy material.

In a preferred embodiment, there is further provided means for depositing a multi-layered back reflector atop the substrate prior to the deposition of the triads of layers of amorphous silicon alloy material. The back reflector includes a layer formed of an oxide of a material selected from the group consisting essentially of zinc, indium, tin, and combinations thereof. The apparatus may also include a bar means and current generation means (d.c. or a.c.) for initiating a glow discharge plasma to prevent oxygen in the oxide-based back reflector layer from contaminating the first layer of amorphous silicon alloy material thereatop. In this case a reactive plasma is employed to be sure the oxygen stoichiometry of the oxide-based back reflector layer is optimum.

When the substrate is electrically conductive, the bar means will define a cathode operatively disposed in spaced relation to said electrically conductive substrate for establishing a hydrogen glow discharge plasma therebetween so as to clean and/or passivate the intrinsic layer of silicon alloy material. The current generation means must be capable of operating to provide a glow discharge plasma at about d.c. to 500 MHz. The bar means is preferably a narrow, electrically conductive cathode bar operatively disposed adjacent the p-cathode which is adapted to deposit the p-doped layer of amorphous silicon alloy material. The narrow cathode bar is approximately 12 inches in length and ⅛ of an inch in width. A narrow electrically conductive cathode bar may also be operatively disposed adjacent the n-cathode adapted to deposit the n-layer of amorphous silicon alloy material.

These and other objects and advantages of the instant invention will become apparent from a careful perusal of the drawings, the detailed description of the invention and the claims which follow hereinafter.

DETAILED DESCRIPTION OF THE DRAWINGS

I. The Photovoltaic Cell

Figure 1:
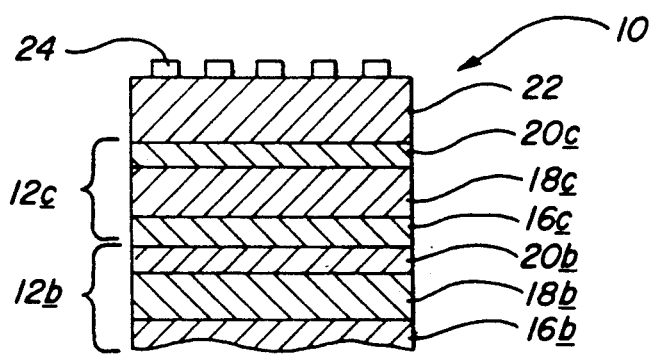
FIG. 1 is a fragmentary, cross-sectional view of a tandem photovoltaic device of the type which may be employed in the practice of the instant invention, said device comprising a plurality of n-i-p-type amorphous silicon alloy photovoltaic cells.

Referring now to the drawings and in particular to FIG. 1, a photovoltaic cell, formed of a plurality of successively deposited p-i-n layers, each of which includes substantially amorphous thin film semiconductor alloy material is shown generally by the reference numeral 10.

More particularly, FIG. 1 shows a p-i-n-type photovoltaic device, such as a solar cell, made up of individual n-i-p type cells, 12a, 12b and 12c. Below the lowermost cell 12a is a substrate 11 which may be formed of glass or a transparent synthetic polymeric member; or formed of a metallic material such as stainless steel, aluminum, tantalum, molybdenum, or chromium; or it may be formed from metallic particles embedded within an insulator. Although certain applications may require the deposition of a thin oxide layer and/or a series of base contacts prior to the deposition of the semiconductor alloy material, the term "substrate" shall include not only a flexible film, but also any elements added thereto by preliminary processing. Also included with the scope of the present invention are substrates formed of synthetic polymers and metals coated with a synthetic polymer to which one or more conductive base electrodes are applied. In a preferred embodiment of the instant invention the back reflector is a multi-layered structure in which a highly reflective layer 11b of silver or aluminum is covered by an optical coupling layer 17 of, for instance, zinc oxide. It is upon this zinc oxide layer that the layers of amorphous silicon alloy material are then deposited.

Each of the cells 12a, 12b and 12c is preferably fabricated with a thin film semiconductor body containing at least a silicon or a silicon germanium alloy material. Each of the semiconductor bodies includes a p-type conductivity semiconductor layer 20a, 20b or 20c; a substantially intrinsic semiconductor layer 18a, 18b or 18c; and an n-type conductivity semiconductor layer 16a, 16b or 16c. Note that the intrinsic layer may include traces of n-type or p-type dopant material without forfeiting its characteristic neutrality; hence, it may be referred to herein as "substantially intrinsic." As illustrated, cell 12b is an intermediate cell, and as indicated in FIG. 1, additional intermediate cells may be stacked on top of the illustrated cells without departing from the spirit or scope of the present invention. Similarly, the tandem cell may include only two stacked cells. Also, although n-i-p photovoltaic cells are illustrated, this invention may be advantageously practiced with differently configured photovoltaic cells, including single or multiple n-i-p cells, Schottky barrier cells, p-n cells, as well as with any other semiconductor device. The term "n-i-p-type", as used herein, is meant to include any aggregation of n-i-p layers operatively disposed to provide a photoactive region for photogenerating charge carriers in response to the absorption of photonic energy.

It is to be understood that following the deposition of the layers of semiconductor alloy material, a further deposition process may be either performed in a separate environment or as part of a continuous process. In this step, a TCO (transparent conductive oxide) layer 22, preferably formed of a material such as tin oxide, indium oxide, indium tin oxide, zinc oxide, cadmium stannate or combinations thereof, is added atop the P layer 20c of the uppermost cell 12c, to function as the top electrode of the cell 10. An electrode grid 24 may be added to the device where the cell is of sufficiently large area, or if the electrical conductivity of the TCO layer 22 is insufficient to obtain the efficient collection of photovoltaically generated current. The grid 24 is adapted to shorten the carrier path and increase the photovoltaic conversion efficiency. As discussed previously, intrinsic layers, 18a, 18b and 18c of the respective cells of 12a, 12b and 12c may be and are preferably formed of semiconductor alloy materials having different band gaps. For example, the intrinsic layer 18c of cell 12c may have an optical band gap of approximately 1.7 eV, the intrinsic layer 18b of cell 12b may have an optical band gap of approximately 1.5 eV and the intrinsic layer 18a of cell 12a may have an optical band gap of approximately 1.3 eV. In this manner, the most efficient use may be made of a large portion of the incident solar spectrum.

II. The Multiple Glow Discharge Deposition Chambers

Figure 2:
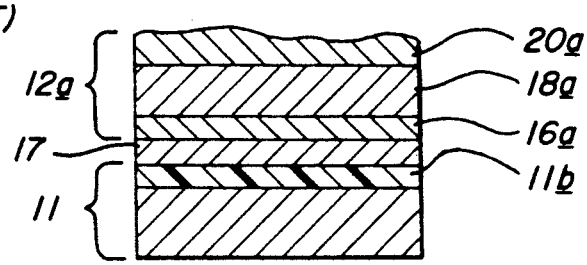
FIG. 2 is a highly stylized schematic view of a multiple chamber deposition apparatus of the type which may be employed for the fabrication of the tandem amorphous silicon alloy photovoltaic cells illustrated in FIG. 1.
Figure 2:
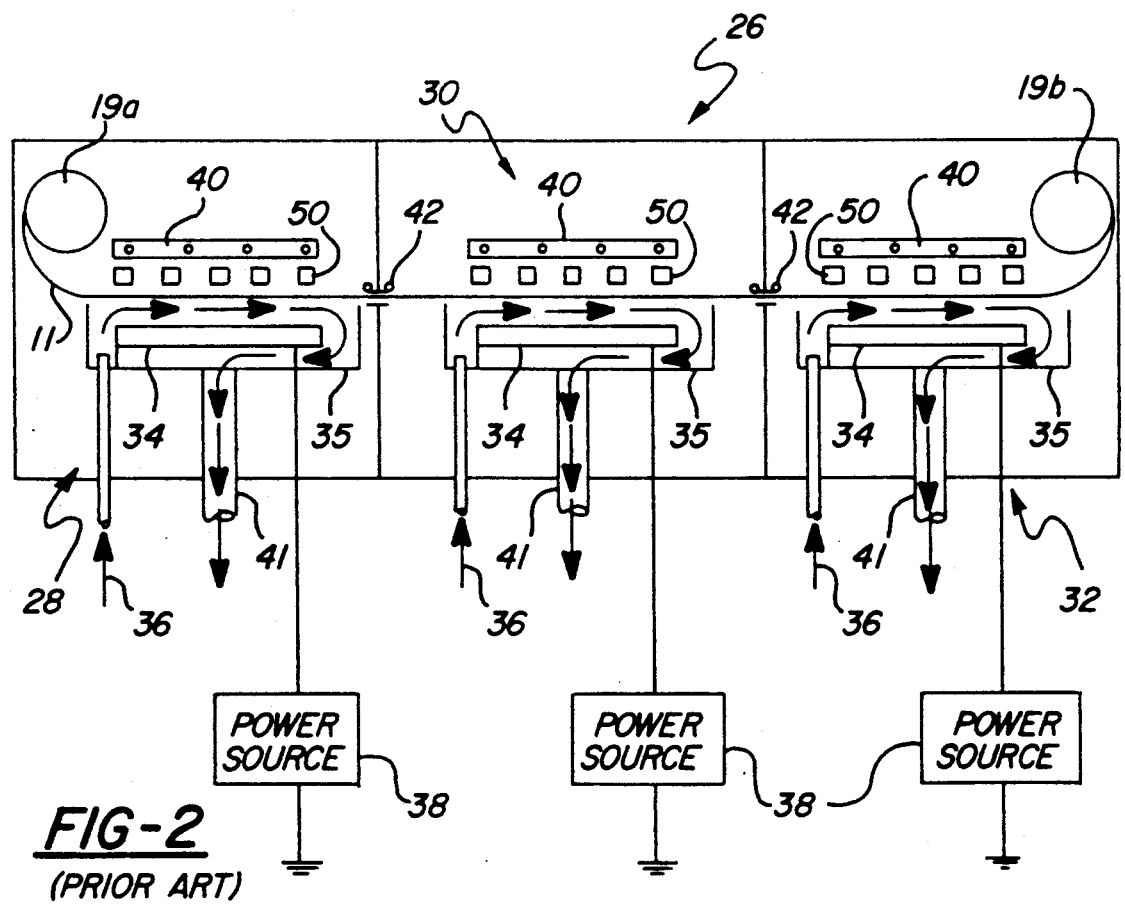

Turning now to FIG. 2, a diagrammatic representation of a multiple chamber glow discharge deposition apparatus for the continuous production of photovoltaic cells is generally illustrated by the reference numeral 26. The deposition apparatus 26 includes a plurality of isolated, dedicated deposition chambers, each chamber of which is operatively interconnected by a gas gate 42 through which (1) inert gases and (2) a web of substrate material 11 are adapted to pass. It is in the apparatus of this type that photovoltaic cells, similar to cell 10 described herein above with respect to FIG. 1, may be readily manufactured.

The apparatus 26 is adapted for the mass production of successive layers of amorphous semiconductor material of n-i-p configuration onto the surface of the web of substrate material 11, which is continually fed therethrough. To deposit the successive layers of semiconductor material required for producing multiple n-i-p-type cells, the apparatus 26 includes at least one triad of deposition chambers. Each triad of deposition chambers comprises a first deposition chamber 28 in which a layer of n-type conductivity silicon alloy material is deposited onto the deposition surface of the substrate 11 as said substrate passes therethrough; a second deposition chamber 30 in which a layer of substantially intrinsic silicon alloy material is deposited atop the deposition surface of the n-type layer as the substrate 11 passes therethrough; and a third deposition chamber 32 in which a layer of p-type silicon alloy material is deposited atop of the intrinsic layer as the substrate 11 passes therethrough. It should be apparent that (1) although only one triad of deposition chambers has been illustrated, additional triads or individual chambers may be added to the apparatus to provide apparatus with the capability of producing photovoltaic cells having any number of n-i-p-type layers of silicon alloy material; (2) the substrate supply core 19a and the substrate take-up core 19b are shown disposed in the deposition chambers for illustrative purposes only, while in reality the cores would be housed in discrete chambers operatively connected to the deposition chambers; (3) although the glow discharge illustrated herein employs cathodes with R.F. power, other energy supplies, such as microwave generators, and D.C. power generators, may be employed without departing from the spirit or scope of the present invention; (4) the gaseous precursor source of silicon alloy material may be introduced to flow in a direction transverse to, parallel to or parallel but opposite to the direction of substrate travel; and (5) additional chambers may be provided upstream of chamber 28 for the vacuum deposition of the multi-layered back reflector 11.

Each deposition chamber 28, 30 and 32 of the triad is adapted to deposit a single layer of silicon alloy material, by glow discharge deposition, onto the exposed surface of the optical coupling layer 17 of the multilayered back reflector of the electrically conductive substrate 11. To that end, each of the deposition chambers 28, 30 and 32 includes: a cathode 34; a shield 35 disclosed about each of the cathodes 34; a process gas supply conduit 36; a radio frequency generator or other source of electromagnetic power 38; a process gas and plasma evacuation conduit 41; a plurality of transversely extending magnetic elements 50 for preventing warpage of the substrate; a plurality of radiant heating elements shown schematically as 40 in FIG. 2; and the gas gates 42 operatively interconnecting the intrinsic deposition chamber and each adjacent dopant deposition chamber.

The supply conduits 36 are operatively associated with the respective cathodes 34 to deliver precursor process gas mixtures to the plasma regions created in each deposition chamber between said cathode and the substrate 11. The cathode shields 35 are adapted to operate in conjunction with the web of substrate material 11 and the evacuation conduit 41 to confine the process gasses within the cathode region of each of the deposition chambers.

The radio frequency or other similar type of power generator 38 operates in conjunction with the cathodes 34, the radiant heaters 40 and the grounded web of substrate material 11 to form the plasma by disassociating the precursor reaction gases entering the deposition chambers into deposition species. These species are then deposited onto the exposed back reflector surface as layers of silicon alloy material. The substrate web 11 is maintained substantially flat by the plurality of rows of magnetic elements 50 which provide an attractive force urging the elongated web of substrate material 11 upwardly, out of the normal sagging path of travel. To form the photovoltaic cell 10 illustrated in FIG. 1, an n-type, substantially amorphous layer of silicon alloy material is deposited onto the web of substrate material 11 in the dopant deposition chamber 28, a layer of substantially intrinsic amorphous silicon alloy material is deposited atop the n-type layer in the intrinsic deposition chamber 30 and a p-type, substantially amorphous layer of silicon alloy material is deposited atop the intrinsic layer in the dopant deposition chamber 32. As a result, in the preferred embodiment, the apparatus 26 is adapted to deposit at least three layers of amorphous silicon alloy material onto the web of substrate material 11, with the intrinsic layer deposited in deposition chamber 30, differing in composition from the layers deposited in deposition chambers 28 and 32 by the absence of at least one element which is referred to as the dopant or doping species.

III. The Plasma Bars

Prior to detailing the structure of the plasma bars to which the instant invention is directed, it will be helpful to further explain the function of those plasma bars in relation to the operation of the amorphous silicon photovoltaic cells described in detail in a foregoing section of this specification.

With respect to amorphous silicon photovoltaic cells which are fabricated as described in detail with respect to FIG. 1, each solar cell is formed by a triad of layers of amorphous silicon alloy material stacked in tandem. Each one of the solar cells is composed of a lowermost layer of n-doped amorphous silicon alloy material, an intermediate layer of substantially intrinsic silicon alloy material and a top layer of p-doped silicon alloy material. Due to the fact that the intrinsic layer of silicon alloy material is slightly n-type, the Fermi level of that intrinsic silicon alloy material is somewhat closer to the conduction band than the valence band, and the intrinsic silicon alloy material is said to be "nu type." In amorphous silicon alloy cells, the major semiconductor junction is formed at the interface between the intrinsic layer and the p-doped layer of silicon alloy material.

It is especially important that this major semiconductor junction interfacial region, the region between the intrinsic layer and the p-doped layer, is as free of defect states which would serve as recombination centers for photogenerated charge carriers, including surface defects states, as possible. Therefore, researchers always take special care to ensure the lowest possible number of surface states and other contaminants at that interfacial region. While not as important to the overall operation of the photovoltaic cell, the surface states and other contaminants existing at the interface between the n-doped layer of silicon alloy material and the intrinsic layer of silicon alloy material can also deleteriously affect the photovoltaic conversion efficiency of the photovoltaic device. Utilizing the invention described herein, it has been possible to gain about 30 millivolts in open circuit voltage by removing phosphorous atoms and $PH_3$ molecules from the surface of the intrinsic layer prior to depositing the p-doped layer as well as by passivating the minor i-n interfacial junction. Accordingly, although not as important, it would be desirable to also operationally dispose the plasma bar of the instant invention between the zone in which the n-doped layer of amorphous silicon alloy material is deposited and the chamber in which the intrinsic layer of amorphous silicon alloy material is deposited, thereby passivating surface states on the exposed surface of the n-type layer of amorphous silicon alloy material prior to the deposition of the intrinsic layer thereupon.

Finally, the plasma bar of the instant invention can also be utilized to improve the overall photovoltaic efficiency by passivating the layer of transparent conductive oxide material upon which the layers of silicon alloy material are subsequently deposited. Oxygen is generally considered to be a deleterious impurity to amorphous silicon alloy material and a reactive plasma, such as an oxygen plasma, will ensure that oxygen does not evolve from the deposition surface of the optical coupling layer of the multi-layered back reflector. It also ensures that other contaminants on that exposed surface will be deposited on the shield surrounding the plasma bar. In this manner, the incorporation of oxygen or other contaminants from the optical coupling layer into the deposited layer of amorphous silicon alloy material will be minimized.

It should therefore be appreciated that there are three major purposes for which the plasma bars of the instant invention can be used in an effort to improve photovoltaic conversion efficiencies in amorphous silicon alloy solar cells. The first purpose is to clean as well as passivate the intrinsic layer and p-doped layer interface before depositing the p-doped layer of amorphous silicon alloy material. This is again the major semiconductor junction and a hydrogen plasma has been demonstrated to provide for the fabrication of improved solar cells, i.e., solar cells operating with improved photoconversion efficiency.

The second purpose is to clean as well as passivate the n-doped layer and the intrinsic layer interface before depositing the intrinsic layer of amorphous silicon alloy material. It will remove chemically adsorbed phosphorous atoms at this minor semiconductor junction of the p-i-n-type solar photovoltaic cell. A hydrogen plasma has been demonstrated to provide for the fabrication of improved solar cells, i.e., solar cells operating with improved photoconversion efficiency. In connection with the n-i interfacial junction, a gain in open circuit voltage of approximately 30 millivolts and an improvement in red fill factor has been shown through the cleaning and passivation of that junction.

The final purpose for which the plasma bars of the instant invention can be used in an effort to improve photovoltaic conversion efficiencies in amorphous silicon alloy solar cells is to prevent oxygen from evolving from the exposed surface of the multilayered back reflector. As discussed to hereinabove, the back reflector includes a highly reflective layer, such as silver, disposed atop the stainless steel web of substrate material and an optical coupling layer, such as zinc oxide, disposed atop the silver layer. Since the oxygen from the zinc oxide layer is likely to evolve from the surface thereof into the first deposited layer of n-doped amorphous silicon alloy material, a reactive plasma prior to the deposition of the n-doped layer will remove the loosely bound oxygen atom as well as any contaminants and prevent oxygen contamination of that n-doped layer of amorphous silicon alloy material. This is in complete contradistinction to previously employed gas gates which could only prevent the diffusion of free-floating gaseous, as opposed to chemically adsorbed, contaminants.

Figure 3:
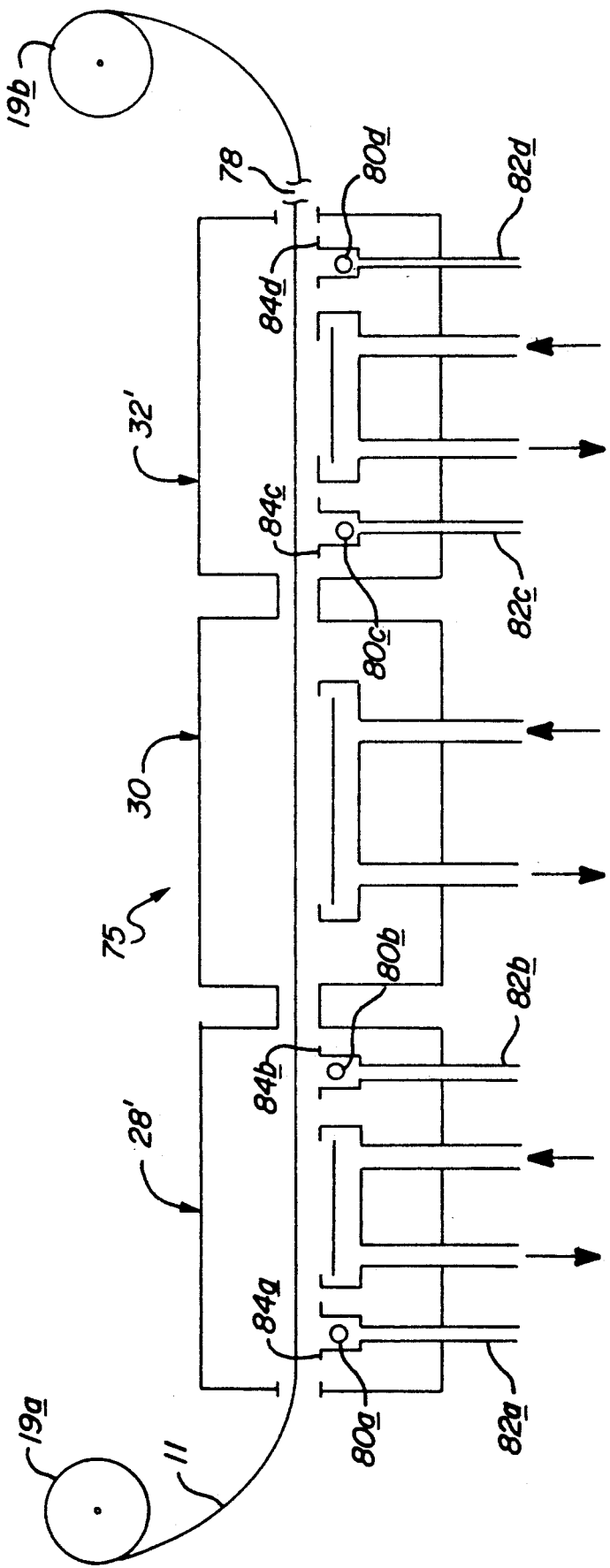
FIG. 3 is a highly stylized schematic view, partially cut away, illustrating the operative disposition of the hydrogen plasma bar of the instant invention operatively disposed so as to passivate previously deposited layers of thin film material prior to the deposition thereonto of the next layer.

Turning now specifically to FIG. 3 of the instant invention, note that reference numeral 75 refers to the improved deposition apparatus of the instant invention. More particularly, where applicable, the FIG. 3 apparatus includes reference numerals which are identical to the reference numerals utilized in FIG. 2 described herein above.

The web of substrate material 11 moves from the payoff roll 19a with highly reflective layer silver, and the thin film layer of zinc oxide, the optical coupling layer, already deposited thereupon. The web of substrate material initially 11 moves through at least one triad of deposition chambers, such as chamber $28^1$ for the deposition of a layer of n-doped amorphous silicon alloy material, the deposition chamber 30 in which a layer of intrinsic amorphous silicon alloy material is deposited upon the n-doped layer and the deposition chamber $32^1$ in which a layer of p-doped amorphous silicon alloy material is deposited atop the intrinsic layer. The broken lines 78 indicated in the path of movement of the web of substrate material 11 before said web reaches the take-up reel 19b, is provided to indicate that additional triads of deposition chambers may be provided without departing from the spirit or scope of the instant invention.

Two elongated, electrically conductive bars 80a and 80b are operatively positioned along the path of travel of the web in the deposition chamber $28^1$. Plasma bar 80a is adapted to prevent the oxygen incorporated in the zinc oxide layer of the multilayered back reflector from evolving and contaminating the subsequently deposited n-doped layer of silicon alloy material in the n-doped deposition chamber $28^1$. Plasma bar 80b is adapted to prevent the phosphorous chemically adsorbed in the exposed surface of the n-doped layer from being transported by the web of substrate material 11 into the intrinsic deposition chamber 30.

Two elongated, electrically conductive bars 80c and 80d are operatively positioned along the path of travel of the web of substrate material 11 in the p-doped deposition chamber $32^1$. Plasma bar 80c is adapted to prevent the boron atoms introduced into the p-deposition region from diffusing into the intrinsic deposition chamber 30 and contaminating the intrinsic layer of amorphous silicon alloy material deposited therein. Plasma bar 80d is operatively disposed at the downstream end of the p chamber 32 and is adapted to prevent the boron chemically adsorbed in the exposed surface of the p-doped layer of amorphous silicon alloy material from being transported by the web of substrate material 11 into the adjacent triad of deposition chambers. This is also a very important function so that charge carriers can freely flow across the p-n interface between the stacked array of photovoltaic cells.

It is to be noted that each of the plasma bars 80a, 80b, 80c and 80d includes a conduit 82a, 82b, 82c and 82d, respectively, through which a flow of gas is established for initiating a plasma. Each of the plasma bars are substantially enclosed by a shield 84a, 84b, 84c and 84d for maintaining the gas introduced via the conduits 82 to the substrate and for affecting a gas gate-like slit on either of the plasma bar. In other words, by keeping the distance between the lips of the shields 84 in close proximity to the web of substrate material 11, other gases in the chambers cannot enter the plasma cleaning and/or passivation region, nor can the cleaning/passivation gases exit the plasma regions to contaminate the depositing layers of silicon alloy material. Further, the lips on the shields 84 provide convenient surfaces upon which the contaminants chemically adsorbed on the web of substrate material can be deposited. Finally, note that it is preferred that hydrogen gas be introduced into conduits 82b, 82c and 82d so as to form a hydrogen plasma to passivate the surface of the web of substrate material or remove chemically adsorbed species therefrom. However, it is preferred that oxygen gas be introduced into conduit 82a so as to form a reactive plasma which optimizes the stoichiometry of the transparent conductive oxide back reflector layer. Of course, other reactive gases, such as helium, carbon tetrafluoride and argon could also be employed without departing from the spirit or scope of the instant invention.

Each of these plasma bars is electrically connected (not shown) in a conventional manner to a source of power, whether dc or ac or microwave. In the preferred embodiment, the power supplied is approximately d.c. to 13.54 megahertz, and in a most preferred embodiment, the power supplied is approximately 75 kilohertz. In order to operatively dispose the bar so as to effectuate the hydrogen plasma operation, the bar is preferably about 1 foot in length and $\frac{1}{8}$ to 1 inch in width. Applicants hypothesize that as the plasma gas of choice (preferably hydrogen) moves therepast, said gas is disassociated into activated species and ionic fragments thereof so as to become highly reactive and either break weak oxygen bonds from the surface of the zinc oxide back reflective layer, or interact with the silicon atoms which contain broken, stressed or deviant bonding configurations on the surface of the n-layer of amorphous silicon alloy material deposited in deposition chamber 28 or the intrinsic layer of amorphous silicon alloy material deposited in chamber 30. The result is the production of a photovoltaic cell exhibiting improved photoconversion efficiencies. For instance, with a tandem amorphous silicon alloy photovoltaic cell, the hydrogen plasma increases the red response by improving the quality of the n-i interface and improving the open circuit voltage by enhancing the built-in field of the photovoltaic cell.

Finally, it is significant to note that the hydrogen plasma bars of the instant invention are very narrow, i.e., in the preferred embodiment, about $\frac{1}{4}$ inch in width so that the overall length of the deposition apparatus 75 is not very much longer than the length of the deposition apparatus 26 of the prior art. As set forth in the background section of the instant specification, this small addition to the length of the apparatus is insignificant and provides for more readily handled lengths of substrate material, easier substrate tracking, steering, alignment and support. The arrangement therefore not only improves solar cell efficiency but provides for more manageable operating conditions. While not specifically detailed hereinabove, the use of elevated temperatures in conjunction with the plasma bars of this invention would further facilitate the removal of chemically adsorbed contaminants from the exposed surfaces of the layers of thin film material passing through the deposition apparatus.

It should be understood that the present invention is not limited to the precise structure illustrated in the aforedescribed embodiments. It is intended rather that the foregoing description of the present preferred embodiments be regarded as illustrative rather than as a limitation of the present invention. It is therefore the following claims, including all equivalents, which define the scope of the instant invention.

What is claimed is:

1. In a multiple chamber glow discharge apparatus of the type comprising a plurality of deposition chambers and means for continuously transporting an elongated web of substrate material along a path of travel passing through said deposition chambers in sequence, wherein each deposition chamber includes: a process gas conduit for introducing a process gas; a cathode; a source of electromagnetic power in electrical communication with the cathode; and means for confining the process gas in a cathode region of the chamber, wherein electromagnetic energy which is supplied to said cathode by said source disassociates the process gas and creates a process gas plasma therefrom in said cathode region, wherein the improvement comprises in combination:

a plasma bar assembly disposed in one of said deposition chambers, along the path of travel of said web of substrate material, said plasma bar assembly comprising:

a plasma bar;

a shield disposed so as to substantially enclose the plasma bar and to define a cleaning/passivation region proximate thereto;

a conduit for introducing a cleaning/passivation gas, said conduit being in communication with said shield and separate from said process gas conduit, said shield disposed in close proximity to said substrate so as to confine the cleaning/passivation gas in the cleaning/passivation region and to exclude entry of the process gas into the cleaning/passivation region; and means for supplying electromagnetic power to said plasma bar, so as to dissociate said cleaning/passivation gas and create a plasma therefrom in said cleaning/passivation region.

2. An apparatus as in claim 1, wherein said means for supplying power to said plasma bar is a source of electromagnetic power separate from the source of electromagnetic power which is in communication with the cathode.

3. An apparatus as in claim 1, wherein said means for supplying electromagnetic power to the plasma bar comprises a power source operative to supply electromagnetic power having a frequency ranging from direct current to 13.54 MHz.

4. An apparatus as in claim 3, wherein said power source is operative to provide electromagnetic power having a frequency of 75 KHz.

5. An apparatus as in claim 1, wherein said shield includes at least one lip portion extending in a direction generally parallel to the path of travel of the web of substrate material.

6. An apparatus as in claim 1, wherein said cleaning/passivation conduit is in communication with a source of hydrogen.

7. An apparatus as in claim 1, wherein said cleaning/passivation conduit is in communication with a source of oxygen.

8. An apparatus as in claim 1, wherein said plasma bar is a cylindrical rod having a diameter in the range of $\frac{1}{8}$ to 1 inch and a length which is equal to or greater than the width of the web of substrate material.

9. An apparatus as in claim 8, wherein said plasma bar has a diameter of $\frac{1}{4}$ inch.

10. An apparatus as in claim 1 further including a second plasma bar assembly generally similar to the first plasma bar assembly, said second plasma bar assembly being disposed in the same chamber as said first plasma bar assembly.

11. An apparatus as in claim 1 further including a second plasma bar assembly which is generally similar to the first plasma bar assembly, said second plasma bar assembly being disposed in a deposition chamber separate from the deposition chamber having the first plasma bar assembly disposed therein.

12. An apparatus as in claim 1 including three deposition chambers disposed so that said web of substrate material passes sequentially therethrough, a first chamber having a plasma region operative to deposit an n-doped body of silicon alloy material on said substrate, a second chamber having a plasma region operative to deposit a substantially intrinsic body of silicon alloy material on said substrate, and a third chamber having a plasma region operative to deposit a p-doped body of silicon alloy material; said apparatus further including a first plasma bar assembly disposed between the plasma region of the first deposition chamber and the plasma region of the second deposition chamber; and a second plasma bar assembly disposed between the plasma region of the second deposition chamber and the plasma region of the third deposition chamber.

13. An apparatus as in claim 12, having a pay-out chamber from which the web of substrate is dispensed, said apparatus further including a third plasma bar assembly disposed between the pay-out chamber and the plasma region of the first deposition chamber.

14. An apparatus as in claim 12, having a take-up chamber in which the substrate is wound after passage through the deposition chambers, said apparatus further including a fourth plasma bar assembly disposed between the plasma region of the third chamber and the take-up chamber.

* * * * *